United States Patent [19]

Kruger et al.

[11] Patent Number: 4,606,058
[45] Date of Patent: Aug. 12, 1986

[54] PROCESS FOR GENERATING CONTROL SIGNALS IN A PREDETERMINABLE PHASE POSITION, CIRCUIT ARRANGEMENT FOR EFFECTUATING THE PROCESS AND UTILIZATION OF THE CIRCUIT ARRANGEMENT

[75] Inventors: Tilmann Kruger, Neunkirchen; Erwin Potthof, Rothenbach; Manfred Barwig, Wendelstein, all of Fed. Rep. of Germany

[73] Assignee: Diehl GmbH & Co., Fed. Rep. of Germany

[21] Appl. No.: 618,488

[22] Filed: Jun. 8, 1984

[30] Foreign Application Priority Data

Jun. 15, 1983 [DE] Fed. Rep. of Germany ....... 3321530

[51] Int. Cl.[4] .............. G04F 1/00; H03K 5/153; H03K 17/28
[52] U.S. Cl. ...................................... 377/39; 377/43; 328/129.1; 307/593; 307/597
[58] Field of Search .................... 377/39, 43, 107; 328/129.1; 307/592, 593, 597

[56] References Cited

U.S. PATENT DOCUMENTS

| | | | |
|---|---|---|---|
| 3,579,126 | 5/1971 | Paul | 328/129.1 |
| 3,936,745 | 2/1976 | Harrington | 328/129.1 |
| 4,025,868 | 5/1977 | Miki et al. | 328/129.1 |
| 4,276,468 | 6/1981 | Nagamoto et al. | 377/39 |

*Primary Examiner*—John S. Heyman
*Attorney, Agent, or Firm*—Scully, Scott, Murphy and Presser

[57] ABSTRACT

A process and an arrangement for generating control signals in a predeterminable phase position relative to an alternating voltage at an at least short term-stable frequency through the utilization of a higher-frequencied, at least short term-stable auxiliary timing pulse. The process contemplates determining the duration of a presettable number of periods of the alternating voltage, in which there are counted the periods of a first auxiliary timing pulse occurring within this duration; counting the periods of a second auxiliary timing pulse of a different frequency which is correlated over a period of time with the first auxiliary timing pulse; and upon coincidence of the period count of the first and second auxiliary timing pulses, generating the control signal. The circuit arrangement consists of standard digital circuits. In particular, with the utilization of the circuit arrangement within the broader circuit concept, can there be employed an already present synchronizing or timing pulse frequency generation of suitable type inasmuch as, besides the adequate level of the timing pulse frequency, no special requirements are set on the quality of the timing pulse.

12 Claims, 3 Drawing Figures

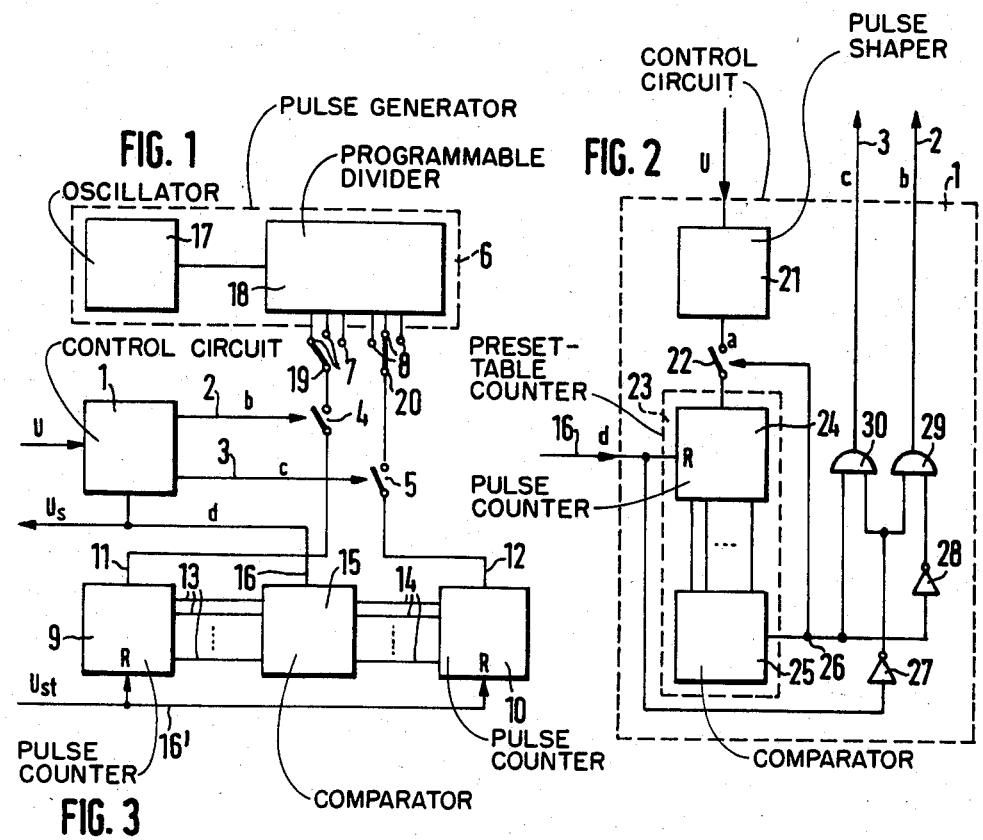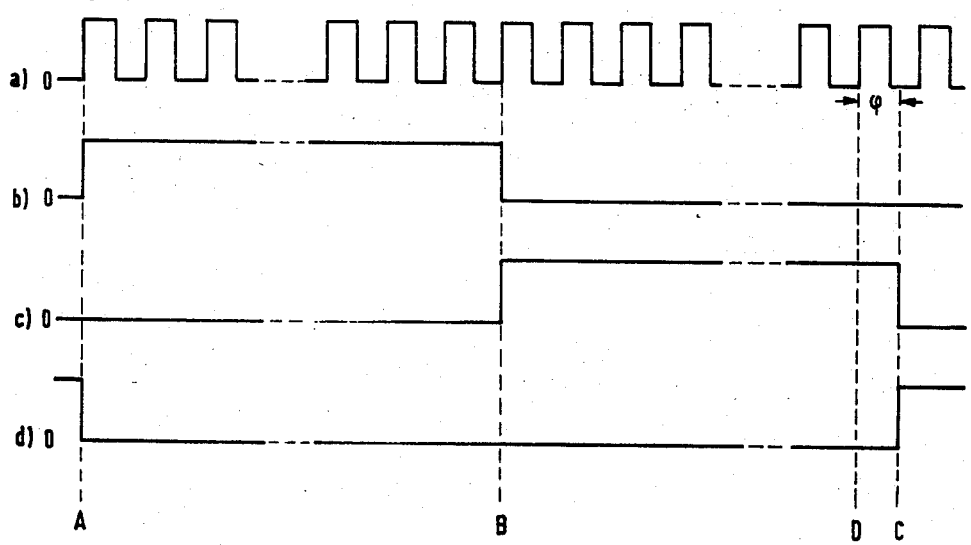

PROCESS FOR GENERATING CONTROL SIGNALS IN A PREDETERMINABLE PHASE POSITION, CIRCUIT ARRANGEMENT FOR EFFECTUATING THE PROCESS AND UTILIZATION OF THE CIRCUIT ARRANGEMENT

BACKGROUND OF THE INVENTION

1. Field of the Invention

The present invention relates to a process for generating control signals in a predeterminable phase position relative to an alternating voltage at an at least short term-stable frequency through the utilization of a higher-frequencied, at least short term-stable auxiliary timing pulse.

2. Discussion of the Prior Art

It is generally known that a determination of the period of a suitable frequency is possible through the intermediary of a higher-frequencied, constant and known rhythmic or timing pulse frequency. When, the number of the timing pulse periods is thereby measured over a first period of the applicable frequency, then the determination of certain phase positions is possible with respect to this applicable frequency on the basis of the currently already counted timing pulse periods; in effect, through the triggering of a signal at a predetermined condition of the pulse counter. Hereby, there is obtained the solution or the exactness from the pulse frequency. A prerequisite for this type of determination of a phase position is the precise knowledge with regard to the pulse frequency and the timely constancy of the applicable frequency and the timing pulse frequency.

Moreover, there are also known circuits for the generation of control signals in predetermined phase positions relative to an alternating voltage, which operate in a purely analog mode. Thus, for example, from the disclosure of German Laid-open Patent Application No. 28 16 592 there can be ascertained a circuit arrangement in which there is scanned the voltage cycle of the alternating voltage over a period of time, and a certain voltage value has a certain phase position associated therewith. At the appearance of this voltage value (wherein a certain direction of the voltage change is predetermined), there is generated a control signal. Hereby, a prerequisite for an exact control by means of this method is the need for the constancy of the frequency and the voltage cycle of the alternating voltage which is to be scanned.

SUMMARY OF THE INVENTION

Accordingly, it is an object of the present invention to provide a process of the above-mentioned type for the generation of control signals in a predeterminable or presettable phase position relative to an alternating voltage, and which operates essentially independently of frequency, the frequency constancy and voltage of an alternating voltage and timing pulse frequencies. Furthermore, the invention contemplates the provision of a circuit arrangement for the effectuation of this process which operates in a purely digital mode and, as a result, is thereby completely integratable in a simple manner.

In order to achieve the foregoing object, a process as described hereinabove contemplates determining the duration of a presettable number of periods of the alternating voltage, in which there are counted the periods of a first auxiliary timing pulse occurring within this duration; counting the periods of a second auxiliary timing pulse of a different frequency which is correlated over a period of time with the first auxiliary timing pulse; and upon coincidence of the period count of the first and second auxiliary timing pulses, generating the control signal.

Thus, in accordance with the contemplated process sequence, there is for the first time realized that the second auxiliary timing pulse is counted in connection with the first auxiliary timing pulse; and that this is particularly advantageous when the process is to be effectuated by means of extremely simply constructed and serially operating logic circuits.

Secondly, the inventive process can also be effectuated when the counting of the first and second auxiliary timing pulses is commenced concurrently. In this manner, there can be reached the shortest possible timely interval between the beginning of the process and the generation of the control signal.

In order to achieve the simplest possible timely correlation between the two auxiliary timing pulses, it is possible to conduct the auxiliary timing pulses from another, for example, from a higher-frequencied basic timing pulse, which can be especially effected through pulse splitting.

The circuit arrangement for the effectuation of the inventive process consists of standard digital circuits which can be integrated without any difficulties. In particular, with the utilization of the circuit arrangement within the broader circuit concept, can there be employed an already present synchronizing or timing pulse frequency generation of suitable type inasmuch as, besides the adequate level of the timing pulse frequency, no special requirements are set on the quality of the timing pulse.

The circuit arrangement can be utilized in an extremely advantageous manner for the actuation of an electromechanical relay, which possesses an essentially constant timely delay between the timepoint of the actuation and the timepoint of the actual switching procedure. Through the provision of the individual circuit parameters, it is possible so control the switching cycle of the relay, that the opening or, respectively, the closing of the operating contacts will lie in such a manner the region of the passage through zero of an alternating voltage which is to be switched, so that the wear of the contact is held to a minimum.

BRIEF DESCRIPTION OF THE DRAWINGS

Reference may now be had to the following detailed description of preferred embodiments of the invention elucidating further inventive features and advantages thereof, taken in conjunction with the accompanying drawings; in which:

FIG. 1 illustrates a block circuit diagram of the inventive circuit arrangement;

FIG. 2 illustrates a block circuit diagram of a module from the block circuit diagram of FIG. 1; and FIG. 3 illustrates a voltage-time plot at different points of the circuit.

DETAILED DESCRIPTION

The present invention thus relates to a process for the generation of control signals in a presettable or predeterminable phase position relative to an alternating voltage U; in effect, control signals $U_s$ are to be generated in a predetermined position within presently a period $T_0$ of the alternating voltage U; for instance, at a phase angle $p$ of 90°, or $\pi/4$ after the defined beginning of a period $T_0$.

For this purpose, there is measured the duration of a pregiven number n of periods $T_0$ of the alternating voltage U, in which, during this duration, there are counted the periods $T_1$ of a first, higher-frequencied auxiliary timing pulse.

In accordance therewith $$n \cdot T_o = k \cdot T_h \quad (1)$$

with k being equal to the number of the counted periods $T_1$ of the first auxiliary timing pulse. The accuracy of this measurement rises with the pregiven number n of the periods $T_o$ of the alternating voltage U and with the rising frequency of the first auxiliary timing pulse.

Furthermore, there are counted the periods $T_2$ of a second, similarly higher-frequencied auxiliary timing pulse of a frequency which differs from that of the first auxiliary timing pulse. Upon coincidence of the number of periods $T_2$ of the second auxiliary timing pulse with the number k of the periods $T_1$ of the first auxiliary timing pulse, there is triggered the control signal $U_s$; in effect, the timely cycle of the alternating voltage U has just reached the phase angle $p$ pursuant to the following equation:

$$k \cdot T_2 = p \cdot T_0 + f(\phi) \quad (2)$$

$$\text{whereby } f(\phi) = \frac{\phi}{2\pi} \cdot T_0 \quad (3.1)$$

$$\text{or} \quad f(\phi) = \frac{\phi}{360°} \cdot T_0 \quad (3.2)$$

is the (recalculation of the phase angle $p$ into units of the period interval $T_0$); and p is equal to the number of the traversed entire period intervals $T_0$ during the counting of the second auxiliary timing pulse.

By inserting the equation (1) in the form:

$$k = n \cdot \frac{T_0}{T_1} \quad (4)$$

in the equation (2) there is then obtained:

$$n \cdot T_0 \cdot \frac{T_2}{T_1} = p \cdot T_0 + f(\phi) \quad (5)$$

by inserting the equation (3.1) (equivalent to the equation (3.2)) and abbreviating with $n \cdot T_0$, there is then obtained the following equation:

$$T_2 : T_1 = \left( p + \frac{\phi}{2\pi} \right) : n \quad (6)$$

This then signifies that the phase position of the generated control signal $U_s$ is independent of the period interval $T_0$ and, thereby, also of the frequency of the alternating voltage U. Furthermore, the position of the control signal $U_s$ at pregiven period numbers n (desired accuracy) and p (delay up to the triggering of the control signal $U_s$) is only dependent upon the ratio of the period intervals $T_1$, $T_2$ or the applicable frequencies of the auxiliary timing pulses, in essence, the two auxiliary timing pulses must be correlated with each other over a period of time. Accordingly, there must only be ensured for the frequencies of the alternating voltage U and the two auxiliary timing pulses, that they are within the time frame of the period counting for the first and the second auxiliary timing pulse, in effect, between the start of the herein-described process and the generation of the control signal $U_s$ constantly within the range of the required accuracy of the phase angle $p$. This should be understood for the designation "short term-stable" herein and also further on. The absolute frequency of the auxiliary timing pulses, in contrast therewith is only of subordinate significance; besides the pregiven number n of the periods $T_0$ of the alternating voltage U, it is also determinate for the accuracy of the phase angle $p$ of the emitted control signal $U_s$. Insofar as the ratio between the frequencies of the auxiliary timing pulses and the alternating voltage is sufficiently large, even frequency fluctuations of the auxiliary timing pulses timing by a factor of two are not detrimental to the control signal $U_s$.

The accuracy at which the control signal $U_s$ is generated at a predetermined phase angle $p$, as already indicated hereinabove, is initially dependent upon the ratio between the frequency of the alternating voltage U and the frequency of the auxiliary timing pulses; the higher-frequencied the first auxiliary timing pulse, the more accurately can there be determined the number n of periods $T_o$ of the alternating voltage U, which forms the basis for the triggering of the control signal $U_s$.

Secondly, the attainable accuracy is dependent upon the number n of the periods $T_0$ of the alternating voltage U, during which there can be counted the number k of the periods $T_1$ of the first auxiliary timing pulse.

Thus, the accuracy of the control signal generation increases, beginning from the timepoint of the start of the proposed process, the later there is generated the control signal $U_s$, in effect, the higher the period numbers n and thereby also of k.

In order to shorten as much as possible the time interval between the start of the process and the generation of the control signal, there can initially be selected the frequency of the second auxiliary timing pulse to be as high as possible (in contrast with the first auxiliary timing pulse). Thereby, the period interval $T_0$ and also the count duration $k \cdot T_2$ is shortened for the second auxiliary timing pulse, at the end of which there is triggered the control signal $U_s$. These relationships for the timing pulse frequencies are then applied, when the counting of the second auxiliary timing pulse is effected in sequence with the counting of the first auxiliary timing pulse. Secondly, it is also possible that the counting of the first and second auxiliary timing pulses can be effectuated concurrently; whereby, however, the period interval $T_2$ of the second auxiliary timing pulse must be greater than that of the period interval $T_1$ of the first auxiliary timing pulse, since the number k of periods $T_1$ (equal to the duration of n periods of $T_0$) must first be present before there can be completed the counting of the periods $T_2$ at the number k.

Hereinbelow there is described a circuit arrangement for the effectuation of the process on the basis of the accompanying drawings.

FIG. 1 illustrates a block circuit diagram of that type of circuit arrangement with a control circuit 1 which is actuated by an alternating voltage U, which can close or open a first switch 4 and a second switch 5 through control lines 2, 3. Hereby, the control circuit 1 actuates at least the first switch 4 at a definite phase angle of the alternating voltage U, preferably during passage through zero. The two switches 4, 5 connect or open the connection between a pulse generating circuit 6 having a plurality of outputs 7, 8 for the generation of different, timewise correlated pulse frequencies and a first timing pulse counter 9 and a second timing pulse counter 10, whereby a counting input 11 of the first pulse counter 9 is connectable through the first switch 4 with one of the outputs 7, and a counting input 12 of the second pulse counter 10 through the second switch 5 with one of the outputs 8 of the pulse generating circuit 6. Outputs 13, 14 of the first and second pulse counter 9, 10 control a comparator 15, which compares the state of the two counters 9, 10 as soon as one of the two counters 9, 10 evidences a count condition which differs from zero, and upon a balance generates the control signal $U_s$ on an output line 16. Furthermore, the control circuit 1 is actuated by the control signal $U_s$ which is generated by the comparator 15.

In the herein described circuit arrangement, the process which is to be carried out therewith is triggered in that the two pulse counters 9, 10 are reset to zero through a starting line 16' by means of a starting pulse $U_{st}$. Thereby, the control signal $u_s$ is no longer generated on the output line 16 (the two pulse counters 9, 10 evidence in the normal instance, originating from the previous process cycle, the same count conditions, so that the comparator 15 generates the control signal $U_s$), the control circuit 1 closes one or both circuit switches 4, 5; for example, at the subsequent zero passage of the alternating voltage U, and the two pulse counters 9, 10 commence counting. The first pulse counter 9 is stopped in that the control circuit 1 opens the first switch 4 as soon as the predetermined number n of periods $T_o$ of the alternating voltage U have elapsed, preferably again at a zero passage of the alternating voltage U. The second pulse counter 10 is stopped in that the control circuit 1 opens the second switch 5 as soon as the control circuit 1 receives the control signal $U_s$ from the comparator 15, which the comparator 15 has generated, upon the balance or equality of the two pulse counters 9, 10, on its output line 16.

The presetting of the phase angle $\rho$ relative to the alternating voltage U, under which there is generated the control signal $U_s$, is determined through the selection of the two timing pulse frequencies at the outputs 7, 8 of the pulse generating circuit 6, or their ratio (at a pregiven number n of periods $T_o$ of the alternating voltage U which are to be measured). The pulse generating circuit 6 hereby preferably consists of an oscillator 17 which generates a higher-frequencied base pulse, and a multistage divider 18 which is connected thereto and which generates different timing pulse frequencies at a plurality of outputs 7, 8 of the pulse generating circuit 6, which are at predetermined ratios among each other, in conformance with the design of the divider 18. By means of two selector switches 19, 20, or equivalent technological means, there can be adjusted the ratios of the timing pulse frequencies which are to be conducted to the two pulse counters 9, 10 for the presently desired phase angle $\rho$. Preferably, there can also be utilized a programmable divider 18. The selector switches 19, 20 can be eliminated when known means or present for the storage of the preprogrammed timing pulse frequencies, for example, the timing pulse frequency ratio, or the respective dividing ratios.

FIG. 2 illustrates a block circuit diagram of a control circuit 1 pursuant to FIG. 1, in which the switches 4, 5 are so actuatable through the control lines 2, 3, that the two pulse counters 9, 10 will operate in sequence. In detail, the control circuit 1 in this embodiment consists of an input circuit 21 which is actuated by the alternating voltage U, which so reshapes the alternating voltage U as to render possible a digital further-processing; in effect, with each zero passage of the alternating voltage U there is generated positive voltage slope. With this reshaped alternating voltage U, by means of a controllable switch 21 there is actuated a presettable counter 23, which preferably counts the positive voltage slopes generated by the input circuit 21. The presettable counter 23 hereby, for example, consists of an ordinary counter 24 and a comparator 25 which compares the count condition with a presettable value and upon equilibrium or equality produces a signal on a control line 26. By means of this control line 26 there again opened the controllable switch 22, and thereby the presettable counter 23 is stopped. With the signal on the control line 26 and with the control signal $U_s$ on the output line 16 of the comparator 10 from FIG. 1, through a logic network there are produced the actuating voltages on the control lines 2, 3, which actuate the switches 3, 4 of FIG. 1. Concurrently, with the appearance of the control signal $U_s$, there is reset the presettable counter 23.

The actuating voltage for the first switch 4 is obtained in that the inverted control signal $U_s$ (inverter 27) is joined with the inverted output signal of the comparator 25 (inverter 28) through an AND-gate 29. The actuating voltage for the second switch 5 is obtained in that the inverted control signal $U_s$ (inverter 27) is joined with the non-inverted output signal of the comparator 25 through an AND-gate 30.

For an understanding of the cycle over a period of time of the functions of the circuits pursuant to FIGS. 1 and 2, in FIG. 3 there is illustrated a voltage-time plot at different relevant circuit points.

Plot (a) in FIG. 3 illustrates the alternating voltage U in a form which, upon need, is prepared for the digital further-processing through the input circuit 21. For the further embodiments, the beginning of a period $T_0$ is defined with a positive voltage slope or flank of this alternating voltage U. Plot (b) in FIG. 3 illustrates the actuating voltage for the first switch 4 and Plot (c) the actuating voltage for the second switch 5.

Plot (d) in FIG. 3 finally illustrates the control signal $U_s$ on the output line 16.

With the starting signal $U_{st}$ (not shown in FIG. 3), the two pulse counters 9, 10 are reset, and with the subsequent positive slope or flank of the alternating voltage U (FIG. 3a) there begins the counting period for the pulse counter 9 (FIG. 3b) and of the presettable counter 23 (timepoint A). After counting of a pregiven number n of periods $T_o$ of the alternating voltage U, the presettable counter 23 stops and produces a signal on the control line 26, by means of which the first pulse counter 9 is stopped (timepoint B in FIG. 3b) and the second pulse counter 10 is started (timepoint B in FIG. 3c).

After reaching of the balance or equality of the count condition of the first and the second pulse counter 9, 10 there is triggered the control signal $U_s$ (timepoint C in FIG. 3d) which then also stops the second pulse counter 10 (timepoint C in FIG. 3c). The difference in time between the timepoint C for the generation of the control signal $U_s$ and the last preceding positive slope of the alternating voltage U (timepoint D) designates the phase angle $\rho$. For a renewed implementation of the process, the two pulse counters 9, 10 must be reset by means of the starting signal $U_{st}$.

In the same manner can there be provided a control circuit 1 in which the actuating voltages for the two switches 4, 5 are so produced whereby the pulse counters 9, 10 do not operate in sequence, but will concurrently begin their counting sequence. Hereby, however, there must be observed that the two pulse counters 9, 10 during the starting phase of the counting, especially for auxiliary timing pulses which only slightly distinguish in frequency, both possess the same count condition. In order to prevent the comparator 15 from generating a control signal $U_s$ already at this point, the comparator 15 must be prevented at least during the starting phase from the delivering of the control signal. This can be, preferably, implemented in that the output line 16 of the comparator 15 is blocked for so long, as long as the switch 4 is closed; in effect, as long as the first pulse counter 9 operates. In the simples instance, there can be provided in the output line 15 a further controllable switch which is actuated by the inverted actuating voltage for the first switch 4.

A circuit arrangement of that type, described hereinabove, can be utilized in an advantageous manner for the actuation of controllable switches, such as electromechanical relays. When such types of controllable switches are utilized for the switching of high-power alternating voltage supplies, then the switching timepoint is preferably set at a zero passage of the alternating voltage. This, for one, reduces any electromagnetic disturbances which occur because of the switching procedure; in effect, reduces any demodulating requirements and also lowers any wear, in particular for mechanical switch contacts. Hereby, the switching at the zero passage for controllable switches is frequently rendered more difficult in that a delay period is present between the actuating timepoint and the actual switching timepoint. By means of the inventive circuit arrangement it is now possible to generate a control signal $U_s$ which assumes a definite phase angle $\rho$ relative to the alternating voltage U which is to be switched on. Through the selection of a suitable ratio for the two auxiliary timing pulses it is thus possible to so adjust the phase angle $\rho$, whereby, at a constant frequency of the alternating voltage U, the encountered delay period of the controllable switch is compensated for in such a manner, that the switching timepoint will coincide with a zero passage of the alternating voltage U.

What is claimed is:

1. In a process for the generation of control signals in a presettable phase position relative to an alternating voltage with an at least a short term-stable frequency through the utilization of a higher-frequencied, at least short term-stable auxiliary timing pulse; the improvement comprising: determining the interval of a pregivable number of periods of the alternating voltage; counting the periods of a first auxiliary time pulse occurring during this interval; counting the periods of a second auxiliary timing pulse of different frequency which are correlated in time with the first auxiliary timing pulse; and generating the control signal at the coincidence of the period numbers of the first and second timing pulse.

2. Process as claimed in claim 1, comprising concurrently starting the counting of the periods of the first and second auxiliary timing pulses, the frequency of the second auxiliary timing pulse being lower than the frequency of the first auxiliary timing pulse.

3. Process as claimed in claim 1, comprising counting the periods of the secondary auxiliary timing pulse subsequent to the counting of the periods of the first auxiliary timing pulse, the frequency of the second auxiliary timing pulse being higher than the frequency of the first auxiliary timing pulse.

4. Process as claimed in claim 1, wherein said first and second auxiliary timing pulses are obtained from a higher-frequencied base pulse.

5. In an arrangement for the generation of control signals in a presettable phase position relative to an alternating voltage with an at least a short term-stable frequency through the utilization of a higher-frequencies, at least short term-stable auxiliary timing pulse; the improvement comprising: a control circuit; a first switch being closeable by said control circuit which includes means for passing a pregivable number of periods of the alternating voltage; a pulse generating circuit; a first pulse counter being connected through said first switch being connected to said pulse generating circuit, a second pulse counter being connected through a second switch to said pulse generating circuit, said second switch being closeable by the control circuit and being openable only at the equality in the count conditions of said first and second pulse counter.

6. Circuit arrangement as claimed in claim 5, wherein said included means in said control circuit includes a presettable counter which generates an output signal for the actuation of at least said first switch after the passing of a pregiven number of periods of the alternating voltage.

7. Circuit arrangement as claimed in claim 5, including a comparator for comparing the count conditions of said first and second pulse counters.

8. Circuit arrangement as claimed in claim 7, wherein said comparator is activated only upon the opening of said first switch.

9. Circuit arrangement as claimed in claim 5, wherein said first and the second pulse counters are switchable between different output frequencies of the pulse generating circuit.

10. Circuit arrangement as claimed in claim 9, wherein said pulse generating circuit comprises an oscillator and a multi-step divider connected to the output of said oscillator, wherein the ratio of the output frequency being selectable for said pulse counters.

11. Circuit arrangement as claimed in claim 10, wherein said divider is a programmable divider.

12. The use of the circuit arrangement as claimed in claim 5, for the actuation of a controllable circuit, such as an electromagnetic relay with a delay period between the actuating timepoint and the switching timepoint whereby the switching timepoint coincides with a zero passage of the alternating voltage.

* * * * *